United States Patent [19]
Chang et al.

[11] Patent Number: 5,959,516
[45] Date of Patent: Sep. 28, 1999

[54] TUNABLE-TRIMMABLE MICRO ELECTRO MECHANICAL SYSTEM (MEMS) CAPACITOR

[75] Inventors: Mau Chung F. Chang, Thousand Oaks; Henry O. Marcy, 5th, Camarillo; Kenneth D. Pedrotti; David R. Pehlke, both of Thousand Oaks; Charles W. Seabury, Calabasas; Jun J. Yao, Thousands Oaks; Sangtae Park, Simi Valley; J. L. Julian Tham, Irvine; Deepak Mehrotra, Thousand Oaks, all of Calif.; James L. Bartlett, Cedar Rapids, Iowa

[73] Assignee: Rockwell Science Center, LLC, Thousand Oaks, Calif.

[21] Appl. No.: 09/004,679

[22] Filed: Jan. 8, 1998

[51] Int. Cl.$^6$ ........................................ H03J 3/20
[52] U.S. Cl. ............................ 334/14; 333/197; 334/81; 361/281
[58] Field of Search ................................. 333/197, 205; 334/10, 14, 78–84; 361/272, 274.1, 277, 278, 281, 287

[56] References Cited

U.S. PATENT DOCUMENTS 5,491,604  2/1996  Nguyen et al. .......................... 361/278
5,578,976  11/1996  Yao et al. ............................... 333/262
5,640,133  6/1997  MacDonald et al. ................... 333/197

OTHER PUBLICATIONS

Young, Darrin J. et al., A Micromachined Variable Capacitor for Monolithic Low–Noise VCOS, Solid–State Sensor and Actuator Workshop, Hilton Head, South Carolina, Jun. 2–6, 1996.

Primary Examiner—Paul Gensler
Attorney, Agent, or Firm—Koppel & Jacobs

[57] ABSTRACT

A high Q MEMS capacitor that can be continuously tuned with a large tuning ratio or reversibly trimmed using an electrostatic force. The tunable capacitor has a master/slave structure in which a control voltage is applied to the master (control) capacitor to set the capacitance of the slave (signal) capacitor to which an RF signal is applied via a suspended mechanical coupler. The master-slave structure reduces tuning error by reducing the signal capacitor's surface area and increasing its spring constant, and may eliminate the need for discrete blocking inductors by electrically isolating the control and signal capacitors. The trimmable capacitor provides an electrostatic actuator that selectively engages a stopper with teeth on a tunable capacitor structure to fix the trimmed capacitance.

24 Claims, 9 Drawing Sheets

TUNABLE-TRIMMABLE MICRO ELECTRO MECHANICAL SYSTEM (MEMS) CAPACITOR

BACKGROUND OF THE INVENTION

1. Field of the Invention

This invention relates to trimmable and continuously tunable capacitors and more specifically to a tunable-trimmable MEMS capacitor that is insensitive to the signal voltage and mechanical noise.

2. Description of the Related Art

Process related variation exists in even the most advanced micro-fabrication facility. At most, the errors caused by process related variations can be reduced to a level that can be tolerated by the applications. As tool-manufacturing improves, fabrication facilities are becoming more advanced, and produce smaller errors. However, more advanced applications call for even tighter tolerances, and thus errors due to process related variations will always exist.

These errors exist in all components including passive elements such as capacitors. Typically, capacitors can be formed by using either a pair of parallel plates separated by a thin dielectric film or an array of such plates horizontally forming an interdigitated finger structure with a thin dielectric film between the fingers. The capacitance value is proportional to the dielectric constant of the film and the overlapping area between the plates, and is inversely proportional to the distance between the plates.

A way of post-process trimming capacitors to eliminate or reduce processing error is very useful and important.

The most commonly used procedure for post-process trimming is laser trimming to reduce the overlapping area. This procedure is rather tedious since it requires measuring each individual device while trimming. In addition, laser trimming is an irreversible procedure, and only gives the specified value at the environmental conditions under which the trimming was performed. Should the capacitance drift at a later time due to changes in temperature, humidity or some other environmental condition, it is very difficult if not impossible to reconfigure the capacitance value.

Capacitance tuning is another important function for the passive components. Unlike capacitance trimming which is more for re-configuration purposes, capacitance tuning is often used for continuous tuning of a sub-circuit such as a tunable filter, for example. The quality factor Q and the tuning ratio determine the quality and tuning range of the sub-circuit.

Currently, solid state varactor diodes are used to provide a tunable capacitor. The varactor's capacitance is set by a bias current, which is generated by a sub-circuit that can consume a significant amount of steady state power. A varactor's tuning ratio is limited, typically less than 50%, which limits its usefulness for some applications such as the frequency agile secured communications. Furthermore, the signal current applied to the varactor will affect the capacitance inducing some measure of error.

Darrin J. Young and Bernhard E. Boser, "A Micromachined Variable Capacitor for Monolithic Low-Noise VCOS," Technical Digest of the 1996 Solid-State Sensor and Actuator Workshop, Hilton Head, S.C., pp. 86–89, 1996 discloses an aluminum micromachined variable capacitor for use as the tuning element in a voltage-controlled oscillator (VCO). This device is fabricated on top of a silicon wafer using conventional deposition techniques, and consists of a thin sheet of aluminum suspended in air above the substrate and anchored with four mechanical folded-beam suspensions acting as springs to form a parallel-plate capacitor. Because their capacitor is designed to operate at very high frequencies, in or above the 900MHz range, its capacitance is low, 2–2.5 pF, and hence has small mass. As a result, the capacitor structure is insensitive to mechanical noise due to vibration or thermal cycling, for example.

A DC control circuit applies a DC voltage $V_C$ across the capacitor that generates an electrostatic force that pulls the movable plate towards the substrate against the spring force until the opposing force reach equilibrium thereby increasing the capacitance. When the DC voltage is reduced, the spring pushes the movable plate away from the substrate until equilibrium is reestablished to reduce the capacitance. The electrostatic force $F_C$ is given by:

$$F_C = (\epsilon_o A V_C^2)/(2x^2) \quad (1)$$

where $\epsilon_o$ is the permittivity in a vacuum, A is the surface area of the parallel plates, and x is the plate spacing. The spring force $F_S$ is given by:

$$F_S = -K_X(\Delta x) \quad (2)$$

where $K_X$ is the spring constant and $\Delta_X$ is the deflection from the relaxed spacing. Compared to varactor diodes, this approach is amenable to monolithic integration in a standard electronic circuit process without sacrificing performance.

However, Young's parallel-plate structure has a number of drawbacks. First, the parallel-plate structure has a maximum vertical deflection of ⅓, which corresponds to a limited tuning range of at most 50%. Second, the capacitor's Q is 62 at 1 GHz, limited by the device parasitics and the amount of metal that can be deposited. Third, to isolate the DC control circuit from the signal voltage a pair of large inductors must be connected between the control circuit and the capacitor. On-chip inductors are of generally poor quality and discrete inductors reduce the overall circuit integration. Lastly, the capacitance value is sensitive to fluctuations in the signal voltage. Like the control voltage, the signal voltage generates an electrostatic force $F_{sig} = (\epsilon_o A V_{rms}^2)/(2x^2)$ where $V_{rms}$ is the root-mean-square value of the signal voltage, that attracts the two parallel plates towards each other, thus changing the capacitance. The surface area A, plate spacing x, and spring constant $K_X$ are the same. Thus, the deflection and, hence, capacitance error can only be controlled by the difference between the control and signal voltages. Typically, $V_{rms}$ is much smaller than $V_C$ so that the error is small but measurable. However, if the signal voltage a becomes large, the error can be quite significant.

SUMMARY OF THE INVENTION

In view of the above problems, the present invention provides a method of fabricating a high Q MEMS capacitor with a capacitance that is reversibly trimmable or continuously tunable with a large tuning ratio and is insensitive to the signal voltage.

A continuously tunable MEMS capacitor comprises a master/slave capacitor structure. The master (control) capacitor responds to control voltage to set the capacitance of the slave (signal) capacitor. A signal is applied to the signal capacitor as part of a sub-circuit such as a tunable filter. In this configuration, the signal capacitor's surface area can be smaller than that of the control capacitor and its spring constant can be increased without limiting the tuning ratio. Parallel-plate and interdigitated capacitors can be fabricated in many different configurations to provide the master-slave structure. The mechanical coupler that slaves the signal capacitor to the control capacitor can also be used to electrically isolate the two capacitors thereby eliminating the need for isolation inductors.

A reversibly trimmable MEMS capacitor comprises a tunable MEMS capacitor and an electrostatic actuator that selectively engages a stopper with teeth on the capacitor to fix its capacitance. To trim the capacitance, the actuator withdraws the stopper, the MEMS capacitor is trimmed to a desired capacitance, and the actuator reengages the stopper. The tunable MEMS capacitor can be either a single tunable capacitor to which both the signal and control voltages are applied or the described master-slave configuration. Since the trimmed capacitance is locked, the master-slave configuration will not improve accuracy but does eliminate the need for isolation inductors.

At frequencies in the microwave range or lower, the mass of the capacitor structure is large enough that the capacitor is sensitive to mechanical noise, primarily due to vibrations but also caused by thermal drift or cycling. A sensor is used to sense the mechanical noise. The sensed motion can then be used to either adjust the control voltage to compensate for the noise directly or to compute an induced capacitance that is then subtracted from the measured value.

The MEMS capacitor structures can be fabricated using a silicon on insulator (SOI) technology in which the top silicon is etched to define the capacitor structures, a deposition layer is patterned to form a mechanical coupler between the control and signal capacitors, and then subjected to a frontside hydrofluoric acid etch to partially remove the silicon dioxide to form the suspended capacitor structure. Alternately, the capacitor structure can be fabricated using a higher performance but more expensive SOI technology in which the top silicon, silicon dioxide or a deposited insulator layer is etched to define the mechanical coupler, and the backside is dry etched to partially remove the substrate to suspend the movable plates and mechanical coupler. To electrically isolate the two capacitors, the frontside is coated with an oxide and deposition sputtered with metal to coat the capacitive structures.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a high Q MEMS capacitor that can be continuously tuned with a large tuning ratio or reversibly trimmed using an electrostatic force. Tuning accuracy is improved by reducing or eliminating the signal capacitor's sensitivity to the signal voltage and mechanical noise. The tunable capacitor has a master/slave structure in which control voltage is applied to a master (control) capacitor to set the capacitance of the slave (signal) capacitor that receives an RF via a suspended mechanical coupler. The master-slave structure reduces tuning error by reducing the signal capacitor's surface area and increasing its spring constant. The need for discrete blocking inductors can be eliminated by fabricating the mechanical coupler to electrically isolate the control and signal capacitors. The trimmable capacitor provides a capacitive actuator that selectively engages a stopper with teeth on a tunable capacitor structure to fix the trimmed capacitance.

Figure 1:
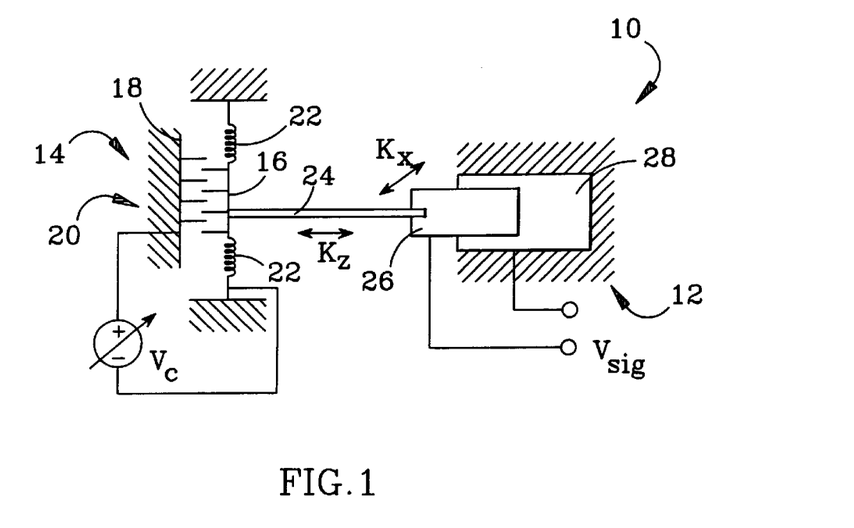
FIG. 1 is a schematic diagram illustrating one embodiment of a master/slave configuration of a tunable MEMS capacitor.

FIG. 1 is a schematic illustration of one embodiment of a tunable MEMS capacitor 10. In the master-slave configuration, a signal voltage $V_{sig}$, typically an RF signal in the MHZ to Ghz frequency range, is applied across a parallel-plate signal capacitor 12. A low frequency control voltage $V_C$ is applied across an interdigitated control capacitor 14 to produce an electrostatic force that attracts its movable plate 16 towards its fixed plate 18. Fixed plate 18 is anchored to the substrate 20 and movable plate 16 is suspended above the substrate by a flexure structure 22. The interdigitated configuration is preferred because it can be designed so that the force is independent of the displacement in the x direction. This is achieved by spacing the fingers evenly such that the forces between them cancel and the fringing forces at the end of the fingers in the Z-direction dominate. As shown, the signal and control capacitors each have a fixed plate and a moveable plate. Alternately, both plates could be moveable.

Movable plate 16 is mechanically coupled, for example, through a micromachined and suspended mechanical coupler 24, to the signal capacitor's movable plate 26 so that its motion relative to a fixed plate 28 is slaved to the control capacitor 14. The signal capacitor's surface area $A_S$ is less than the control capacitor's surface area $A_C$, suitably ½ to 1/10, to reduce the electrostatic force associated with the signal voltage. In general, the signal and control capacitors can be parallel-plate or interdigitated structures and can be fabricated as vertical or horizontal devices.

As shown, the control and signal capacitors are oriented so that the electrostatic force F. produced by the signal voltage is orthogonal to the motion of its movable plate 24 in the z direction. Although the signal capacitor is a parallel-plate capacitor, its capacitance is set by moving the plates laterally to control surface area $A_S$ rather than the conventional approach of moving the plates longitudinally to control their spacing. As a result, the lateral spring constant $K_Z$ can be relatively small thereby providing a large range of motion and a correspondingly large tuning ratio, suitably 10:1. Furthermore, mechanical coupler 24 can be fabricated so that the signal capacitor's vertical spring constant $K_X$ is very large thereby further reducing any deflection caused by the signal voltage. In the preferred embodiment, both mechanisms are used to reduce the influence of the signal voltage. However, in certain applications either one can be used individually if so desired. In addition, the mechanical coupler can be fabricated from a relatively insulating material to electrically isolate the control and signal capacitors.

Figure 2:
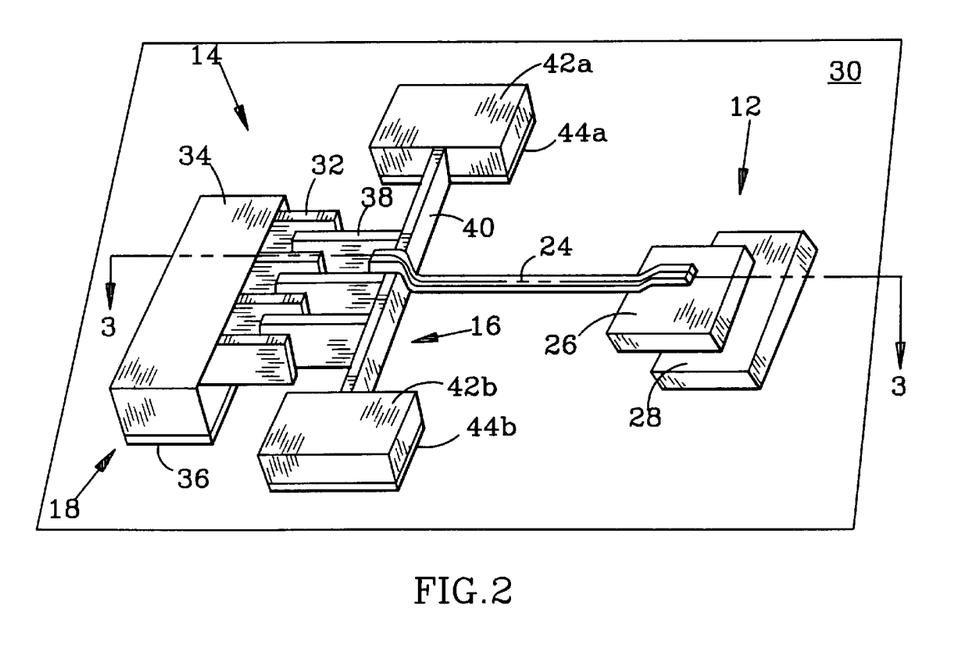
FIG. 2 is a perspective view of the tunable MEMS capacitor shown in FIG. 1.

FIG. 2 depicts one implementation of the tunable MEMS capacitor 10 shown in FIG. 1, in which the capacitor is fabricated on a single crystal silicon substrate 30. Master capacitor 14 is formed from a top silicon to provide the required mechanical properties, i.e. the ability to bend without fatiguing. For some applications, the silicon is conductive enough to provide adequate electrical properties without having to coat the structure with metal.

Fixed plate 18 comprises fingers 32 formed with a contact 34 that is anchored through a silicon dioxide base 36 to substrate 30. Flexure structure 22 includes a beam 40 that is suspended between two contacts 42a and 42b that are anchored through silicon dioxide bases 44a and 44b, respectively, to substrate 30. Fingers 38 formed in beam 40 define moveable plate 16. The length of beam 40 provides the small spring constant $K_z$ that allows it to flex and move interdigitated fingers 38 with respect to fingers 32 in response to the electrostatic fringing force produced by the control voltage.

Since signal capacitor 12 does not have to bend, it is suitably designed to improve electrical characteristics. As shown, fixed and movable plates 28 and 26 are formed from a highly conductive material such as metal, suitably aluminum, or heavily doped polysilicon. Alternately, both plates could be formed from the top silicon in a horizontal structure. This simplifies fabrication but sacrifices electrical performance somewhat.

Mechanical coupler 24 is suspended above substrate 30 and mechanically connects beam 40 to plate 26. The mechanical coupler is preferably formed from a relatively insulating material, less conductive then either Si or metal, so that the control and signal capacitors are effectively electrically isolating. In this case, mechanical coupler 24 is formed by patterning a layer of silicon nitride ($Si_3N_4$). Furthermore, the material and thickness of the mechanical coupler are selected so that the spring constant $K_X$ is very large to further reduce any movement of plate 26 in response to the signal voltage.

There are many possible ways of fabricating the tunable MEMS capacitor. One way is to use a silicon on insulator (SOI) wafer structure where the top silicon will be used as the capacitor structural material. FIGS. 3a–3f illustrate the key steps in making the tunable capacitor shown in FIG. 2 using a frontside processing and wet acid release SOI approach that is relatively inexpensive. Alternately, an SOI technique that etches the backside of the substrate to release the device (as detailed in FIGS. 5a–5e for a different capacitor implementation) may be used. This technique is more expensive but reduces parasitics.

Figure 3A:
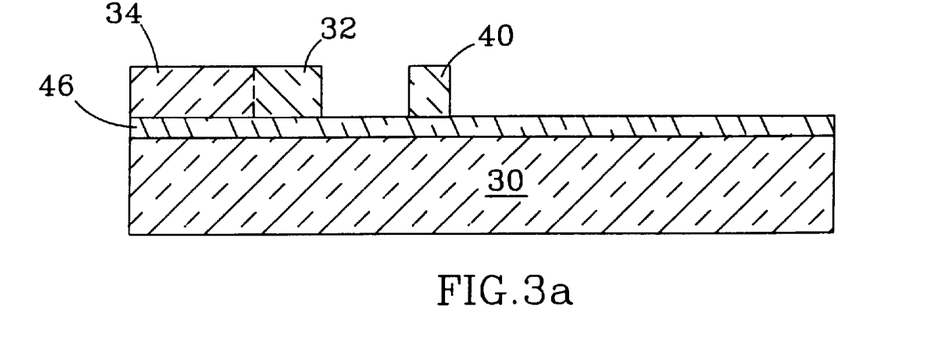
FIGS. 3a through 3f illustrate the fabrication of the MEMS capacitor along section line 3—3 in FIG. 2 using a frontside SOI technology.
Figure 3B:
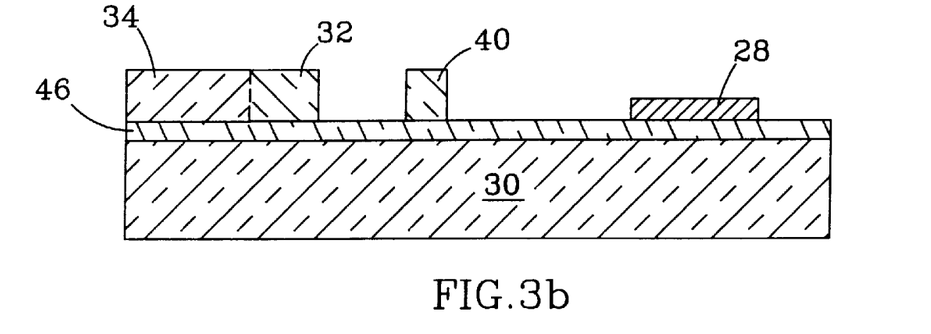
Figure 3C:
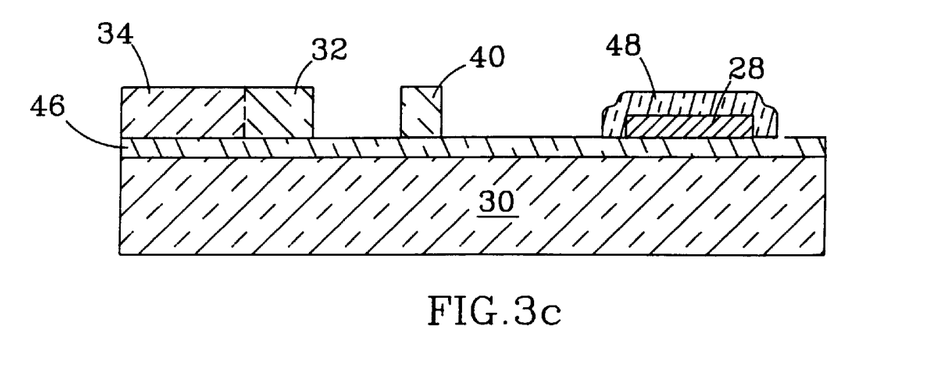
Figure 3D:
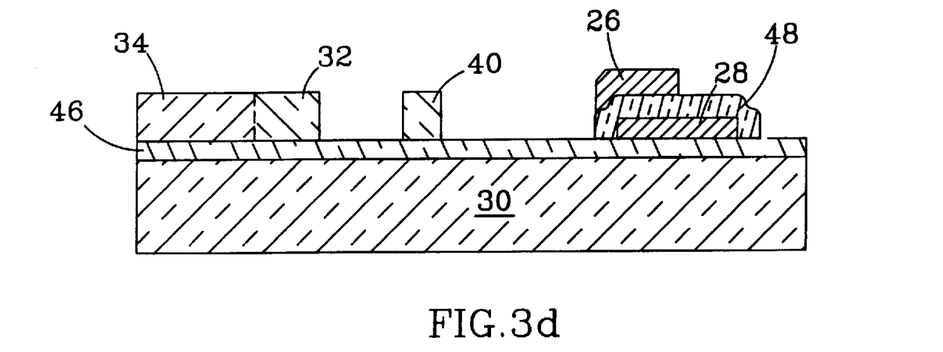
Figure 3E:
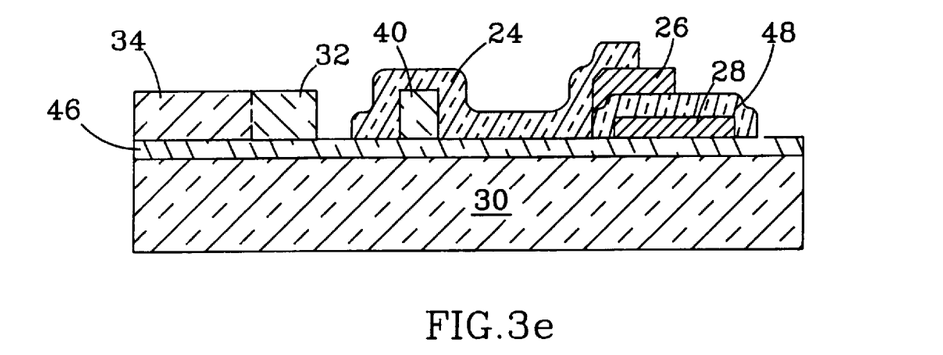
Figure 3F:
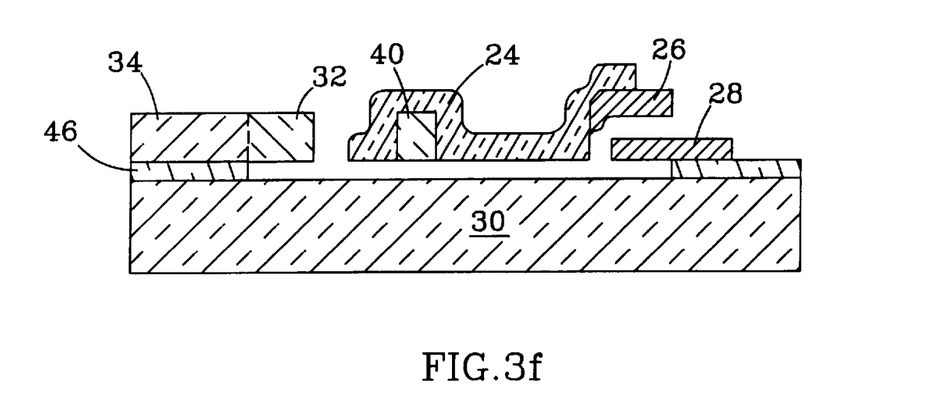

As shown in FIG. 3a, a photo resist is first patterned with the structural geometry of the master capacitor and then transferred to the top silicon, which is suitably 10's–100's of microns thick, using reactive ion etching with an anisotropic sidewall profile that stops at the silicon dioxide layer 46. The etch forms the control capacitor's contact 34 with fingers 32 and beam 40 as shown along this section. The wafer is then patterned and aluminum deposited to define the signal capacitor's fixed plate 28, suitably a few microns thick, as shown in FIG. 3b. Thereafter, a silicon dioxide spacer layer 48, suitably less than a micron thick, is formed over fixed plate 28 and another aluminum layer, suitably a few microns thick, is deposited thereon to define the signal capacitor's movable plate 26 as shown in FIGS. 3c and 3d, respectively. Next, a layer of $Si_3N_4$, suitably 0.5–2.0 microns thick to provide sufficient rigidity in the x direction, is patterned on the wafer to form mechanical coupler 24 that rigidly couples movable plate 26 to beam 40. Lastly, the wafer is subjected to a hydrofluoric acid (wet) etch to partially remove the underlying silicon dioxide film 46, leaving the large structures still intact with substrate 30 while the small geometry structures are free standing as shown in FIG. 3f. To improve the electrical performance of the tunable capacitor, a metal film can be sputtered without a mask. The metal film would have discontinuities between the silicon structures and the silicon substrate, providing isolation for the devices.

Figure 4:
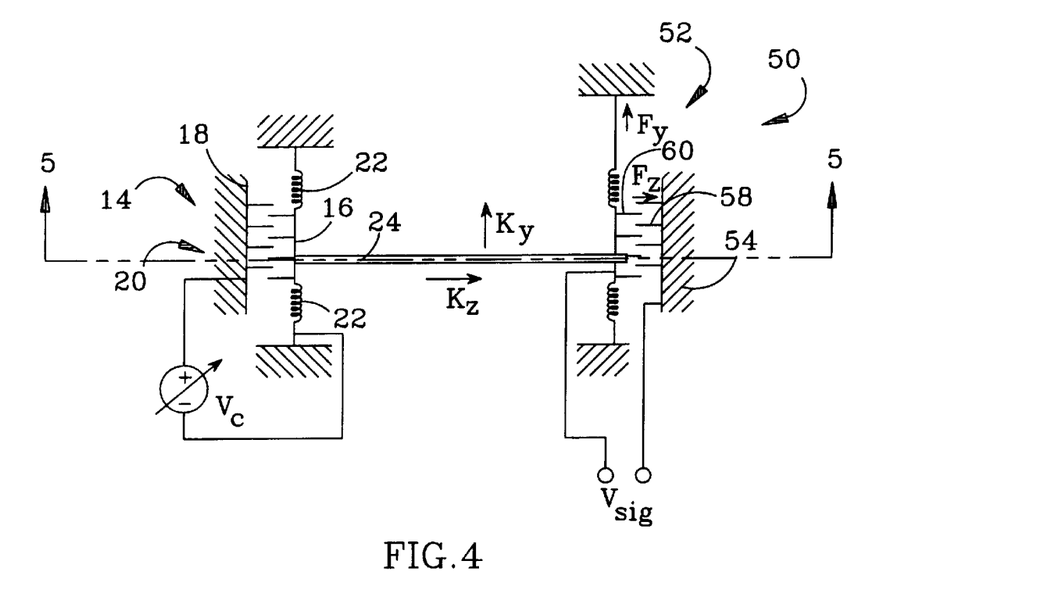
FIG. 4 is a schematic diagram illustrating another embodiment of the master/slave tunable MEMS capacitor.

FIG. 4 is an alternate embodiment of the tunable MEMS capacitor 50 in which the parallel plate capacitor 12 in the embodiment shown in FIG. 1 has been replaced with an interdigitated signal capacitor 52. Capacitor 52 includes a fixed plate 54 that is anchored to the substrate 30 and a movable plate 56 that is controlled by mechanical coupler 24. In order to make the direction of force on the signal capacitor perpendicular to the direction of motion so that the spring constant can be low in the direction of motion and high in the direction of the force, the interdigitated fingers 58 and 60 are offset so that they are asymmetric. As a result, the force $F_y$ between the fingers dominates the much smaller fringing force $F_z$. The advantage to this embodiment is that all of the device structure can be defined when the top silicon is patterned, thus eliminating the steps in FIGS. 3b–d. Furthermore, as described below, the mechanical coupler 24 can also be defined in the top silicon and/or the silicon dioxide layers using the backside SOI process thereby eliminating the separate processing step shown in FIG. 3.

The backside fabrication process depicted in FIGS. 5a through 5e for the MEMs tunable capacitor starts out with a Silicon-On-Insulator (SOI) substrate 62 which is used for a number of reasons. One reason is that it provides an insulation layer for the device and another reason is that it provides an etch-stop for both the device layer (frontside) and the handle wafer (backside) silicon etches. The backside etch reduces parasitics and air damping of the mechanical coupler.

The whole fabrication process consists of four masks with three of them used for frontside process and one for backside process. The first mask is used to etch about half of the device layer thickness with straight sidewalls. The second mask is used to create a structure which self-isolates and mechanically couples metal on two suspended capacitive structures. The third mask is used for finishing the etch started with the first mask, etching through the device layer. The fourth mask is used to create backside trenches which aid the releasing of the suspendable structures.

Figure 5A:
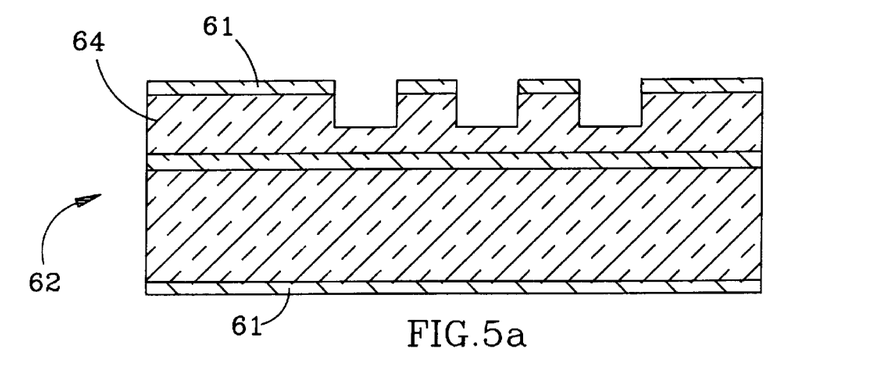
FIGS. 5a through 5e illustrate the fabrication of the MEMS capacitor shown in FIG. 4 along section 5—5 using a backside SOI fabrication technology.
Figure 5B:
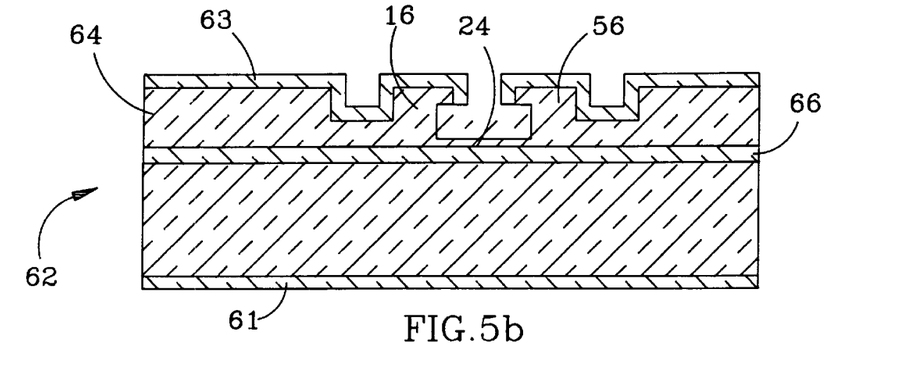
Figure 5C:
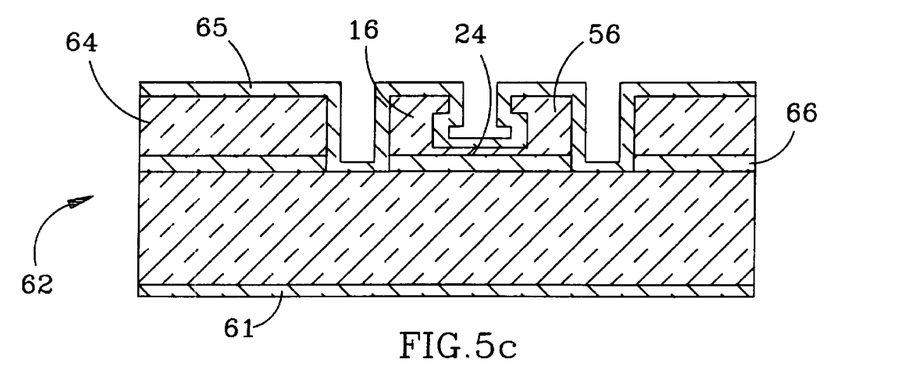

As shown in FIG. 5a, an oxide 61 is grown on both sides of the substrate and, using the photo resist pattern of the first mask, is etched by Reactive Ion Etching (RIE) along with about half of the silicon device layer 64 underneath using an Inductively Coupled Plasma (ICP) etcher. As shown in FIG. 5b, another oxide layer 63 is deposited by Plasma Enhanced Chemical Vapor Deposition (PECVD) and patterned using a second mask on the trench floor to prepare the substrate for creating an opening between the movable interdigitated plates 16 and 56. With the patterned oxide, an opening is created using an isotropic silicon etch that defines mechanical coupler 24, suitably 0.2–2.0 microns thick. As shown in FIG. 5c, another layer of PECVD oxide 65 is deposited and patterned with the third mask using an RIE etch to electrically isolate the capacitor structures but joining them structurally. Using the same patterned photo resist, the unfinished trench etch is continued to etch through device layer 64 using an ICP etcher. Buried oxide layer 66 is then etched by RIE and isolation layer 65 is extended to cover the exposed silicon sidewalls using PECVD deposition.

Figure 5D:
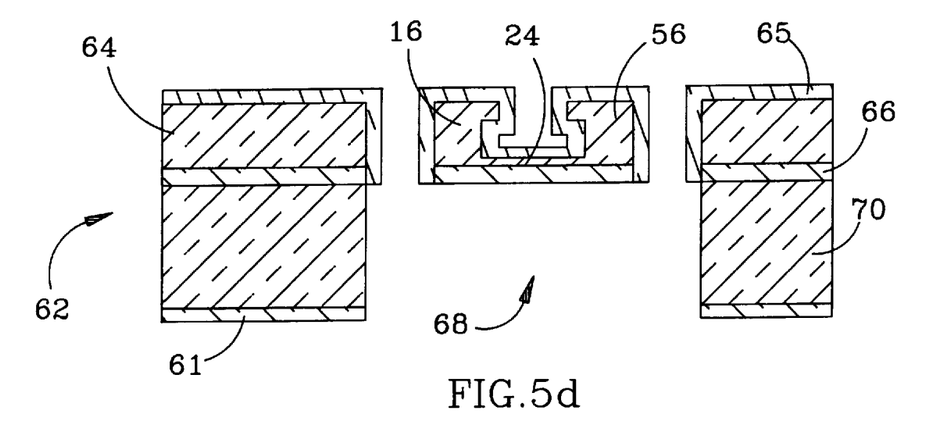

After the frontside process is done, the backside of the wafer is patterned and etched using an ICP etcher to create backside trenches 68 in substrate 70 that form a cavity there through, which aid the releasing of suspendable structures as shown in FIG. 5d. As shown, the backside etch stops at the silicon dioxide layer such that the mechanical coupler 24 is formed from the top silicon and silicon dioxide layers. Alternately, the backside etch may remove the silicon dioxide so that mechanical coupler 24 is formed entirely from the top silicon.

Figure 5E:
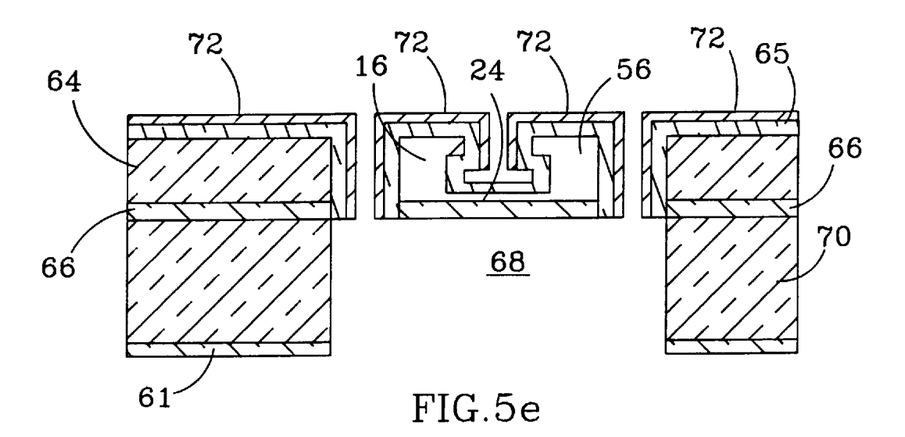

After both the frontside and the backside processes are done, sputtered aluminum 72 is deposited on the frontside as shown in FIG. 5e to form the capacitor structures, which are anchored to the insulator layer and suspended over 68 cavity, which reduces air damping. Since the mechanical coupler is made from the same material as the capacitor structures, oxide layer 65 and the sputtered aluminum 72 must be added to provide electrical isolation. No patterning is needed at this point since the metal layers are self-isolated by structure.

Alternately, the mechanical coupler 24 can be fabricated in only the silicon dioxide layer 66. This is accomplished by patterning top silicon 64 down to silicon dioxide layer 66. Thereafter, the silicon dioxide layer 66 is patterned using a combination of photolithography and etching to physically isolate the capacitors' fixed and suspended structures and to define mechanical coupler 24. During backside processing, the etch stops at the silicon dioxide layer thereby releasing the suspended structures with the mechanical coupler 24 formed between them.

Figure 6:
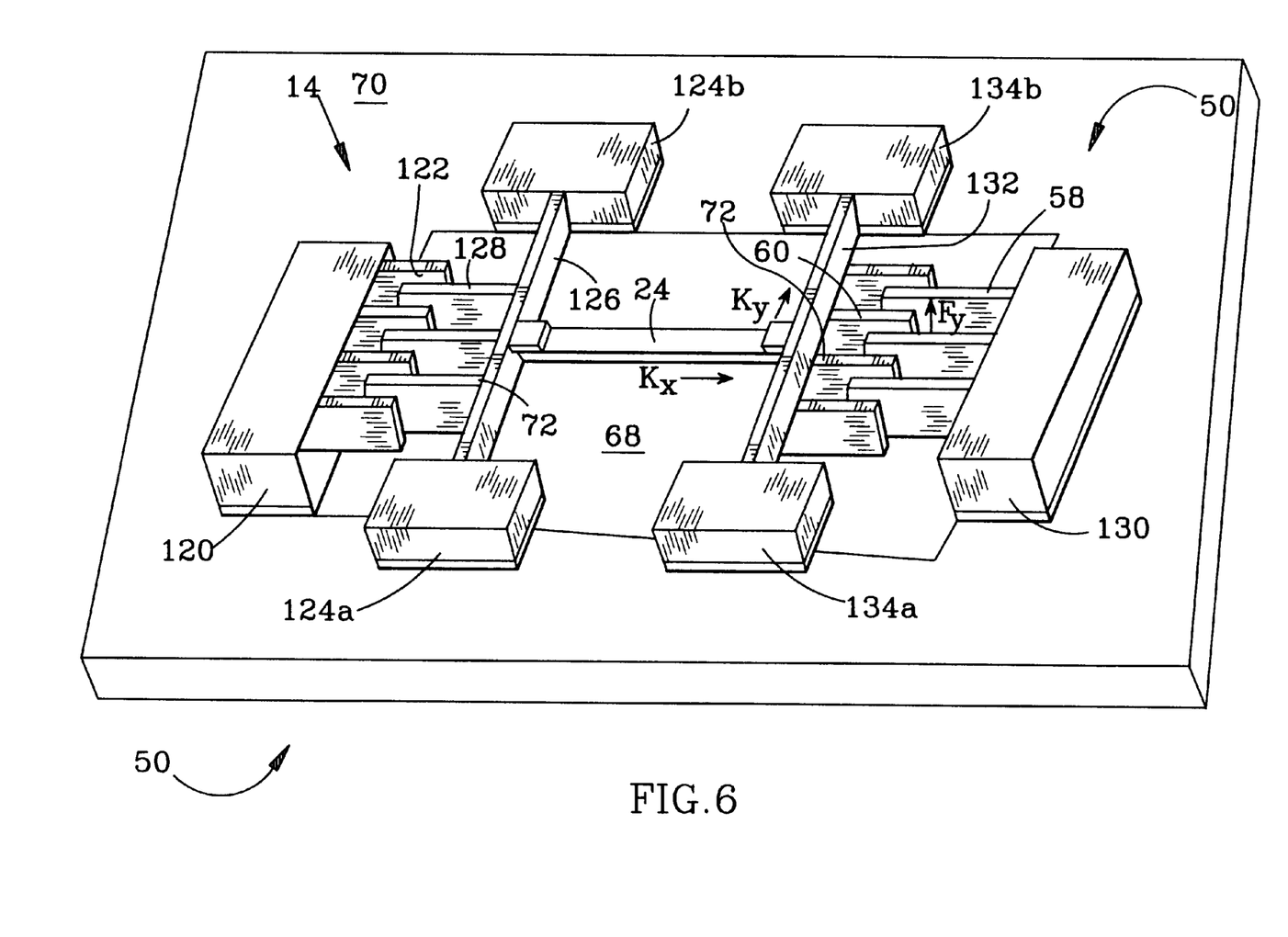
FIG. 6 is a perspective view of the tunable MEMS capacitor shown in FIG. 4 using the SOI fabrication technology illustrated in FIGS. 5a through 5e.

FIG. 6 is a perspective view of the tunable MEMS capacitor 50 shown in FIG. 4 fabricated using the SOI technology illustrated in FIGS. 5a through 5e. A Silicon-On-Insulator (SOI) substrate 62 includes a silicon substrate 70 having a cavity 68 etched there through, a patterned silicon dioxide layer 66, and a top silicon layer 64 in which the control capacitor 14, signal capacitor 52 and mechanical coupler 24 are all patterned as horizontal structures. Mechanical coupler 24 optionally includes a thin back side layer of silicon dioxide. Control capacitor 14 comprises a contact 120 on substrate 70 adjacent cavity 68 that defines fixed plate 18 and a plurality of fingers 122 that extend over the cavity 68. A pair of contacts 124a and 124b are formed on substrate 70 on opposite sides of cavity 68. A beam 126 is connected between contacts 124a and 124b and suspended over cavity 68. A plurality of fingers 128 extend from beam 126 so that they are interdigitated with fingers 122. The fingers are symmetrically (evenly) spaced so that the electrostatic force produced by the control voltage is predominantly the fringing force between the ends of the fingers and the opposing plate. This force causes beam 126 to flex along a direction of motion parallel to its fingers and perpendicular to the beam.

Signal capacitor 52 comprises a contact 130 on substrate 70 with a plurality of fingers 58 that extend over cavity 68. A second beam 132 is connected between pair of contacts 134a and 134b on substrate 70 on opposite sides of cavity 68 so that the beam is suspended over cavity 68. A plurality of fingers 60 extend from beam 132 so that they are asymmetrically interdigitated with fingers 58. As a result, the electrostatic force produced by the signal voltage is orthogonal to the direction of motion. Furthermore, the overlapping surface area of the signal capacitor's fingers is less than that of the control capacitor.

Mechanical coupler 24 is formed between beams 126 and 132 and suspended above cavity 68 to slave the motion of the signal capacitor's beam 132 to the motion of the control capacitor's beam 126 to tune the capacitance of said signal capacitor. Because all of the structure is formed in the top silicon, the control and signal capacitors are not, at this point, electrically isolated. Therefore, a deposition layer 72, suitably aluminum, covers the structure, specifically the capacitors' fingers, to increase the conductivity of the control and signal capacitors with respect to the mechanical coupler so that they are electrically isolated. The discontinuity between mechanical coupler 24 and beams 126 and 132 creates a discontinuity in the deposition layer that provides isolation.

Figure 7:
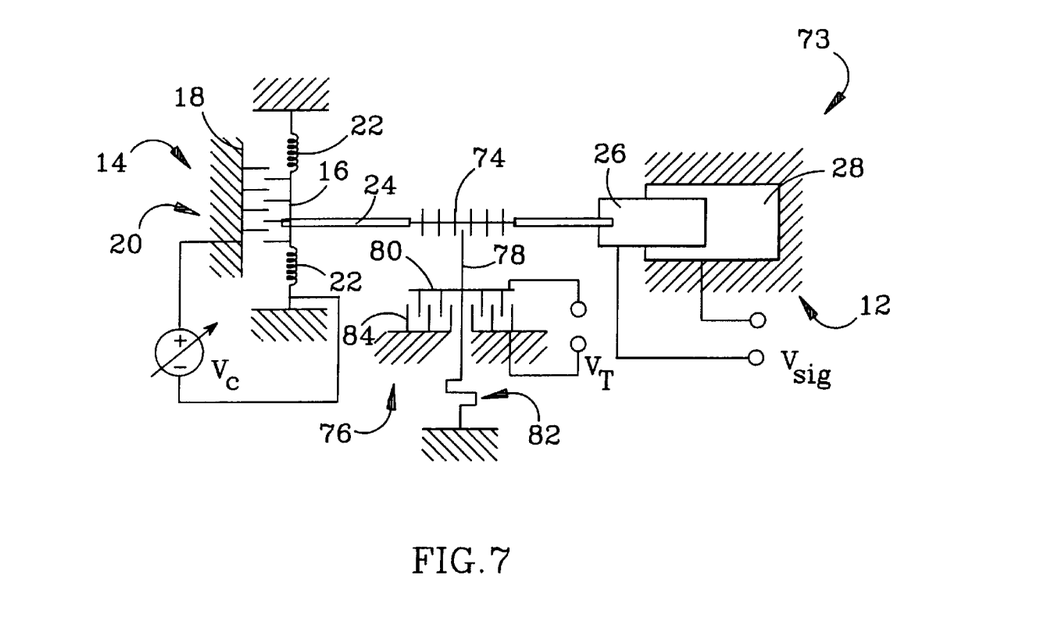
FIG. 7 is a schematic diagram illustrating one embodiment of a trimmable MEMs capacitor that uses a capacitive actuator in a master/slave configuration.

FIG. 7 is a schematic illustration of one embodiment of a trimmable MEMS capacitor 73, in which the tunable capacitor shown in FIG. 1 has been modified to place teeth 74 along mechanical coupler 24 and include an electrostatically controlled actuator 76 perpendicular to the mechanical coupler that selectively engages a stopper 78 with the teeth 74 to trim and then lock the signal capacitor. Actuator 76 includes a movable interdigitated plate 80 that is suspended above the substrate and is connected to stopper 78 and a spring mechanism 82. As shown, the spring mechanism is a folded beam. Alternately, the plate could be suspended on both ends similar to the movable plate of the control capacitor. The interdigitated plate 80 meshes with a pair of fixed interdigitated plates 84 disposed on opposite sides of the stopper.

Normally, the spring holds the stopper in place inside the teeth such that the signal capacitor's movable plate 80 is incapable of moving. During trimming, $V_T$ produces an electrostatic force that pulls stopper 78 away from teeth 74 to allow plate 26 to move. Once the trimming is complete, $V_T$ is switched allowing stopper 78 to extend back into teeth 74, and prevents further movement of plate 26. This configuration ensures that, even after the trimming voltage is withdrawn, plate 26 is incapable of further motion. Since the trimmed capacitance is locked, the master-slave configuration will not improve accuracy but does eliminate the need for isolation inductors.

Figure 8:
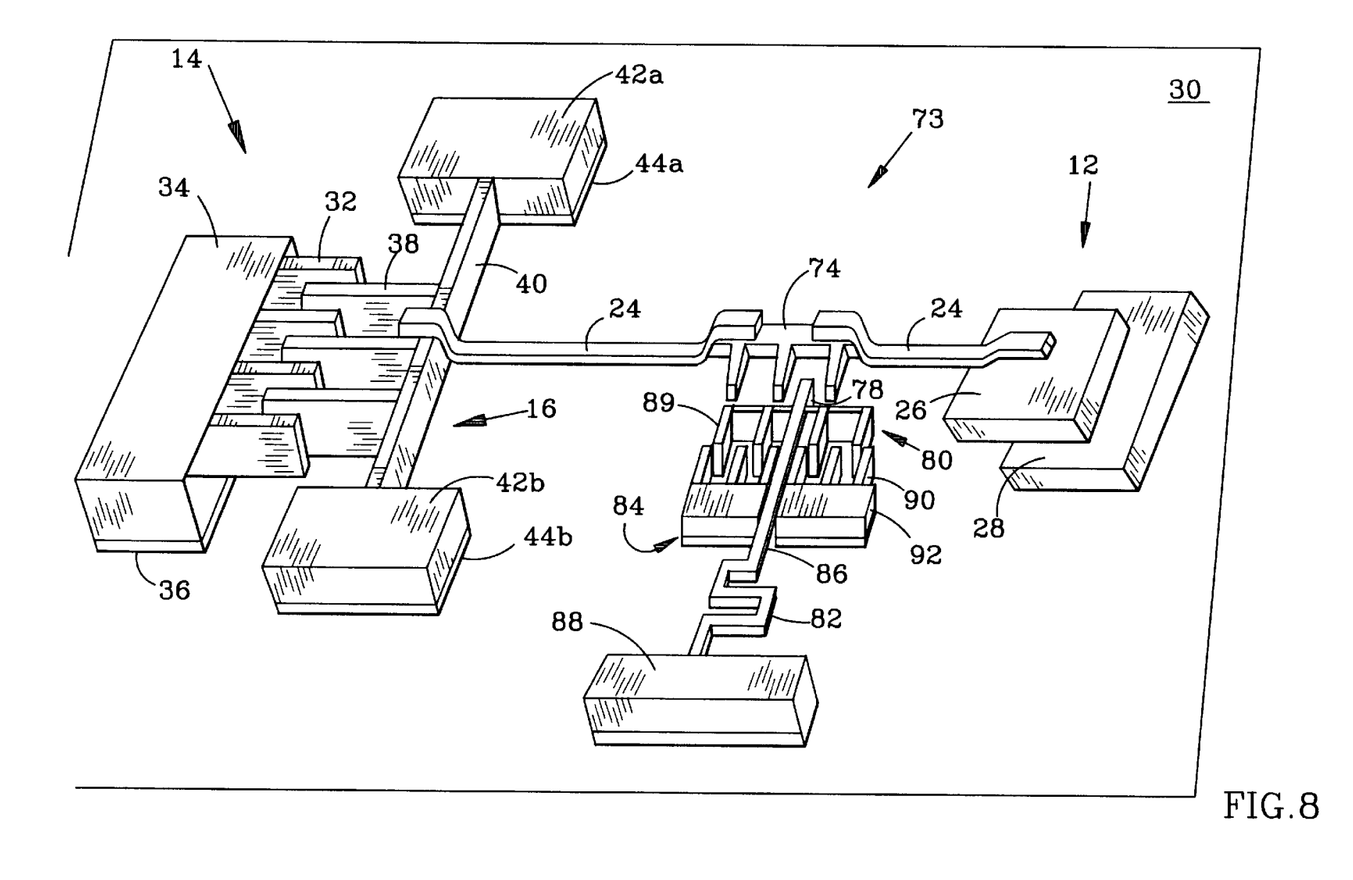
FIG. 8 is a perspective view of the trimmable MEMS capacitor shown in FIG. 7.

FIG. 8 depicts one implementation of the trimmable MEMS capacitor 73 shown in FIG. 7, in which the capacitor is fabricated on a single crystal silicon substrate 30. The structure is the same as that shown in FIG. 2 except that teeth 74, stopper 78, and actuator mechanism 76 have been added. The additional structure is all formed from the top silicon to provide the desired mechanical properties. Teeth 74 are formed in the top silicon such that beam 24 is broken into two separate pieces. A suspended beam 86 extends into teeth 74 to provide stopper 78. The other end of beam 86 is folded to provide spring mechanism 82 and connected to a contact 88 that is anchored through the silicon dioxide layer to substrate 30. The actuator mechanisms's suspended plate 80 is formed perpendicular to beam 86 so that its fingers 89 lie parallel to the spring motion. Fixed plates 84 comprise fingers 90 formed with contacts 92 that are anchored through a silicon dioxide base to substrate 30 on either side of beam 86.

Figure 9:
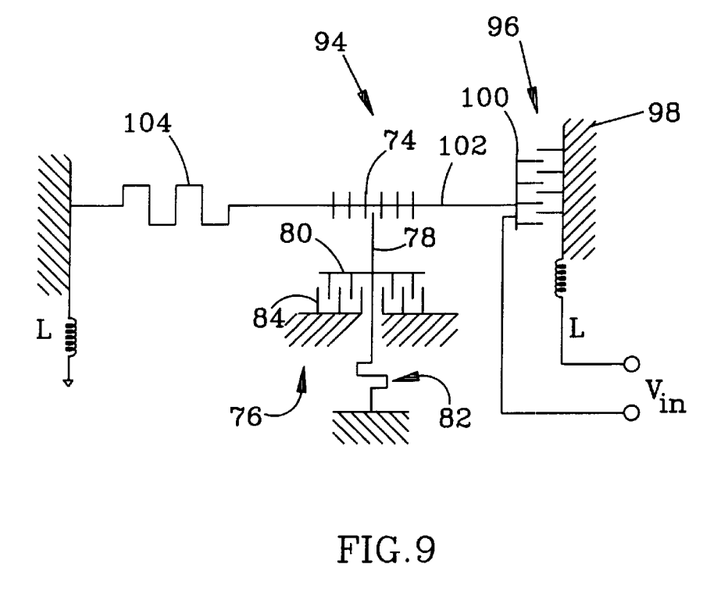
FIG. 9 is a schematic diagram of another embodiment of a trimmable MEMS capacitor that uses a capacitive actuator.

As shown in FIG. 9, a trimmable MEMS capacitor 94 can be implemented without the master/slave structure, although biasing inductors L will be required. In this case, a combined low frequency control and high frequency signal voltage $V_{in}$ is applied across a single signal capacitor 96. One side 98 of the capacitor is fixed to the substrate while the other side 100 is connected to a suspended beam 102. A spring mechanism 104 is formed in the opposite end of beam 102 so that the capacitor can move back-and-forth.

The same trimming mechanism; teeth 74, stopper 78 and actuator 76 used in FIG. 7 and method of trimming are used in the single capacitor structure.

Figure 10:
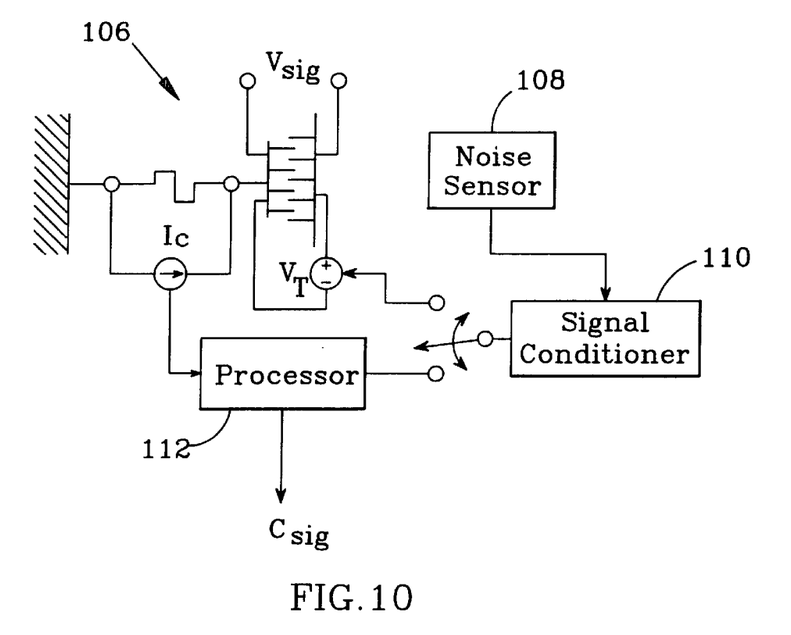
FIG. 10 is a block diagram illustrating a mechanical noise compensation system.

Besides the force produced by the signal voltage, a signal capacitor 106 may also be subjected to external mechanical noise that would cause its movable plate to move and change its capacitance as shown in FIG. 10. The mechanical noise may be due to vibration or thermal cycling. This unintended capacitance change can be reduced or minimized by using a noise sensor 108 to detect the external motion. A signal conditioner 110 conditions the detected signal to either a) directly adjust the control voltage $V_T$ to null out the effect or b) calculate the induced change in the capacitance. A processor 112 subtracts the induced capacitance from the signal capacitance to compensate for the motion. To compensate for external vibration, the noise sensor 108 is suitably a tunable capacitor identical to said signal capacitor 106 except that neither control or signal voltage are applied to it. In this case, the response of the noise sensor is exclusively due to vibration and thus can be used to directly null or compensate for the changes in the signal capacitor.

While several illustrative embodiments of the invention have been shown and described, numerous variations and alternate embodiments will occur to those skilled in the art. Such variations and alternate embodiments are contemplated, and can be made with without departing from the spirit and scope of the invention as defined in the appended claims.

We claim:

1. A tunable Micro Electro Mechanical System (MEMS) capacitor, comprising:
    a substrate;
    a control capacitor on said substrate, said control capacitor having a pair of opposing plates, at least one of said plates being suspended so that it moves in response to an electrostatic force produced by a fixed control voltage applied across said control capacitor;
    a signal capacitor on said substrate, said signal capacitor having a pair of opposing plates, at least one of said plates being suspended so that it can move; and
    a non-conductive mechanical coupler suspended above said substrate that slaves the motion of said signal capacitor's movable plate to the motion of said control capacitor's movable plate to tune the capacitance of said signal capacitor to a fixed value in response to said fixed control voltage, said signal capacitor having a pair of terminals connected across its pair of opposing plates across which said tuned capacitance is taken, said mechanical coupler electrically isolating said control capacitor from said signal capacitor.

2. The tunable MEMS capacitor of claim 1, wherein said control capacitor is an interdigitated capacitor whose plates have interdigitated fingers in which the moveable plate moves the signal capacitor's moveable plate to set its capacitance, said interdigitated fingers having a symmetric spacing where the electrostatic force is set by the fringing force between the end of the fingers and opposing plate because the electrostatic forces between fingers cancels out so that the electrostatic force is proportional to the control voltage.

3. The tunable MEMS capacitor of claim 1, wherein said signal voltage produces an electrostatic force on the signal capacitor's movable plate that is orthogonal to its direction of motion, said control capacitor's movable plate being suspended from a flexure structure that exhibits a small spring constant in the direction of motion that allows a wide range of motion for tuning the signal capacitor, said mechanical coupler exhibiting a large spring constant in the direction of the electrostatic force produced by the signal voltage to resist deflection of the signal capacitor's movable plate.

4. The tunable MEMS capacitor of claim 3, wherein said signal capacitor is a parallel-plate capacitor in which the control capacitor moves the signal capacitor's moveable plate so as to change the signal capacitor's surface area to tune its capacitance while maintaining a substantially constant spacing between the signal capacitor's plates.

5. The tunable MEMS capacitor of claim 3, wherein said signal capacitor is an interdigitated capacitor whose plates have asymmetrically spaced interdigitated fingers where the electrostatic force between fingers dominates the fringing force between the end of the fingers and opposing plate so that the direction of motion is orthogonal to the direction of the electrostatic force.

6. A tunable Micro Electro Mechanical System (MEMS) capacitor, comprising:
    a substrate;
    a control capacitor on said substrate, said control capacitor having a pair of opposing plates, at least one of said plates being suspended so that it moves in response to an electrostatic force produced by a control voltage applied across said control capacitor;
    a signal capacitor on said substrate that responds to a signal voltage, said signal capacitor having a pair of opposing plates, at least one of said plates being suspended so that it can move; and
    a mechanical coupler suspended above said substrate that slaves the motion of said signal capacitor's movable plate to the motion of said control capacitor's movable plate to tune the capacitance of said signal capacitor, wherein the electrostatic forces exerted on the control and signal capacitors' movable plates are proportional to their respective overlapping surface areas $A_C$ and $A_S$, said signal capacitor's surface area $A_S$ being smaller than said control capacitor's surface area $A_C$ so that the electrostatic force exerted on the signal capacitor in response to the signal voltage is smaller than it would be were the signal and control capacitors integrated into a single capacitor that responded to both said control and signal voltages, said reduced electrostatic force reducing the deflection of said signal capacitor's movable plate in response to the signal voltage and thus reducing the distortion of its capacitance.

7. A tunable Micro Electro Mechanical System (MEMS) capacitor, comprising:
    a substrate;
    a control capacitor on said substrate, said control capacitor having a pair of opposing plates, at least one of said plates being suspended so that it moves in response to an electrostatic force produced by a control voltage applied across said control capacitor;
    a signal capacitor on said substrate that responds to a signal voltage, said signal capacitor having a pair of opposing plates, at least one of said plates being suspended so that it can move; and
    a mechanical coupler suspended above said substrate that slaves the motion of said signal capacitor's movable plate to the motion of said control capacitor's movable plate to tune the capacitance of said signal capacitor, wherein said substrate is a Silicon-On-Insulator (SOI) substrate comprising a silicon insulator layer on which said MEMS capacitor is formed, a silicon dioxide layer for releasing the MEMS capacitor's moveable parts from said insulator layer, and a top silicon layer in which said control capacitor is defined, said mechanical coupler being formed in a deposition layer that is less conductive than said top silicon to electrically isolate said control and signal capacitors.

8. A tunable Micro Electro Mechanical System (MEMS) capacitor, comprising:
   a substrate;
   a control capacitor on said substrate, said control capacitor having a pair of opposing plates, at least one of said plates being suspended so that it moves in response to an electrostatic force produced by a control voltage applied across said control capacitor;
   a signal capacitor on said substrate that responds to a signal voltage, said signal capacitor having a pair of opposing plates, at least one of said plates being suspended so that it can move; and
   a mechanical coupler suspended above said substrate that slaves the motion of said signal capacitor's movable plate to the motion of said control capacitor's movable plate to tune the capacitance of said signal capacitor, wherein said substrate is a Silicon-On-Insulator (SOI) substrate comprising a silicon insulator layer having a cavity etched therethrough, a patterned silicon dioxide layer, and a top silicon layer in which said control capacitor, mechanical coupler, and signal capacitor are defined so that they are anchored to said insulator layer and suspended over the cavity, said control and signal capacitors further comprising a metal deposition layer that increases their conductivity relative to the mechanical coupler so that said control and signal capacitors are electrically isolated.

9. A tunable Micro Electro Mechanical System (MEMS) capacitor, comprising:
   a substrate;
   a control capacitor on said substrate, said control capacitor having a pair of opposing plates, at least one of said plates being suspended so that it moves in response to an electrostatic force produced by a control voltage applied across said control capacitor;
   a signal capacitor on said substrate that responds to a signal voltage, said signal capacitor having a pair of opposing plates, at least one of said plates being suspended so that it can move; and
   a mechanical coupler suspended above said substrate that slaves the motion of said signal capacitor's movable plate to the motion of said control capacitor's movable plate to tune the capacitance of said signal capacitor, wherein said substrate is a Silicon-On-Insulator (SOI) substrate comprising a silicon insulator layer having a cavity etched therethrough, a silicon dioxide layer in which said mechanical coupler is patterned, and a top silicon layer in which said control capacitor and signal capacitor are defined so that they are anchored to said insulator layer and suspended over the cavity, said control and signal capacitors further comprising a metal deposition layer that increases their conductivity relative to the mechanical coupler so that said control and signal capacitors are electrically isolated.

10. The tunable MEMS capacitor of claim 9, wherein said substrate is a Silicon-On-Insulator (SOI) substrate comprising a silicon substrate having a cavity etched there through, a patterned silicon dioxide layer, and a top silicon layer in which said flexure structure, control capacitor, mechanical coupler, and signal capacitor are defined so that they are anchored to said substrate and suspended over the cavity, said control and signal capacitors further comprising a metal deposition layer that increases their conductivity relative to the mechanical coupler so that said control and signal capacitors are electrically isolated.

11. A tunable Micro Electro Mechanical System (MEMS) capacitor, comprising:
   a substrate;
   a flexure structure that is anchored to and suspended above said substrate so that it flexes along a direction of motion;
   a control capacitor on said substrate, said control capacitor having a pair of opposing plates, at least one of said plates being connected to said flexure structure so that it is movable in response to an electrostatic force produced by a control voltage across said control capacitor, said force being proportional to the plates' overlapping surface area $A_C$;
   a signal capacitor on said substrate that receives a signal voltage, said signal capacitor having a pair of opposing plates, at least one of said plates being suspended so that it is movable; and
   a mechanical coupler that slaves the motion of said signal capacitor's movable plate to the motion of said control capacitor's movable plate to set the capacitance of said signal capacitor and electrically isolates the signal capacitor from the control capacitor,
   said flexure structure exhibiting a small spring constant in the direction of motion to allow a wide range of motion for tuning the signal capacitor, and
   said signal capacitor's surface area $A_S$ being smaller then the control capacitor's surface area $A_C$ and the spring constant of said isolator in the direction of an electrostatic force produced by said signal voltage being large to reduce the sensitivity of said signal capacitor's moveable plate to the signal voltage.

12. The tunable MEMS capacitor of claim 11, wherein said signal capacitor is a parallel-plate capacitor in which the control capacitor moves the signal capacitor's moveable plate so as to change the signal capacitor's surface area $A_S$ to set its capacitance while maintaining a substantially constant spacing between the signal capacitor's plates.

13. The tunable MEMS capacitor of claim 11, wherein said signal capacitor is an interdigitated capacitor whose plates have asymmetrically spaced interdigitated fingers where electrostatic force between fingers dominates the fringing force between the end of the fingers and opposing plate so that the direction of motion is orthogonal to the direction of the electrostatic force.

14. A tunable Micro Electro Mechanical System (MEMS) capacitor, comprising:
   a Silicon-On-Insulator (SOI) substrate comprising a silicon insulator layer having a cavity etched therethrough, a patterned silicon dioxide layer, and a top silicon layer in which are patterned:
      a control capacitor comprising:
         a first contact on said substrate adjacent said cavity;
         a first plurality of fingers that extend from said first contact over said cavity;
         second and third contacts on said substrate on opposite sides of said cavity;
         a first beam that is connected between said second and third contacts and suspended over said cavity;
         a second plurality of fingers that extend from said first beam so that they are interdigitated with the first plurality of fingers that extend from said first contact, said first beam being flexible along a direction of motion parallel to its fingers so that it moves in response to an electrostatic force produced by a control voltage applied across said control capacitor;

a signal capacitor that receives a signal voltage, comprising:
  a fourth contact on said substrate adjacent said cavity;
  a third plurality of fingers that extend from said fourth contact over said cavity;
  fifth and sixth contacts on said substrate on opposite sides of said cavity;
  a second beam that is connected between said fifth and sixth contacts and suspended over said cavity;
  a fourth plurality of fingers that extend from said second beam so that they are interdigitated with the third plurality of fingers that extend from said fourth contact;

a mechanical coupler suspended above the cavity in said substrate between said first and second beams that slaves the motion of said signal capacitor's second beam to the motion of said control capacitor's first beam to tune the capacitance of said signal capacitor; and a deposition layer on said fingers that increases the conductivity of the control and signal capacitors with respect to said mechanical coupler so that they are electrically isolated.

15. The tunable MEMS capacitor of claim 14, wherein said signal capacitor's third and fourth plurality of fingers are asymmetrically spaced so that the electrostatic force produced by the signal voltage is predominantly between the fingers and orthogonal to the direction of motion, the spring constants of said first and second beams being small in the direction of motion to allow a wide range of motion for tuning the signal capacitor and large in the direction of the electrostatic force on the signal capacitor's fingers to reduce the deflection of the signal capacitance due to the signal voltage.

16. The tunable MEMS capacitor of claim 14, wherein the electrostatic forces exerted on the control and signal capacitors' movable plates are proportional to the respective overlapping surface areas $A_C$ and $A_S$ of their fingers, said signal capacitor's surface area $A_S$ being smaller than said control capacitor's surface area $A_C$ so that the electrostatic force exerted on the signal capacitor in response to the signal voltage is smaller than it would be were the signal and control capacitors integrated into a single capacitor that responded to both said control and signal voltages, said reduced electrostatic force reducing the deflection of the signal capacitance due to the signal voltage.

17. A trimmable Micro Electro Mechanical System (MEMS) capacitor, comprising:
  a substrate;
  a flexure structure that is anchored to and suspended above said substrate so that it flexes along a direction of motion;
  a signal capacitor on said substrate that receives a signal voltage, said signal capacitor having a pair of opposing plates, at least one of said plates being connected to said flexure structure so that it can move in response to a control voltage to set the capacitance of said signal capacitor;
  a plurality of teeth that are coupled to and move with said moving plate; and
  an electrostatic actuator on said substrate, said actuator responding to a switch voltage to disengage a stopper and allow said control voltage to trim the signal capacitor's capacitance and then reengage said stopper in said teeth such that the movable plate is fixed.

18. The trimmable MEMS capacitor of claim 17, wherein said actuator comprises a tunable capacitor in which the stopper is attached to a moveable plate that is suspended from a flexure mechanism so that it opposes a fixed plate, said switch voltage creating an electrostatic force between the plates that causes the moveable plate to move against the spring force to engage and disengage the stopper.

19. The trimmable MEMS capacitor of claim 17, wherein said signal capacitor comprises:
  a master capacitor on said substrate, said master capacitor having a pair of opposing plates, at least one of said plates being suspended so that it is movable in response to an electrostatic force produced by a control voltage applied across said master capacitor;
  a slave capacitor on said substrate that responds to the signal voltage, said slave capacitor having a pair of opposing plates, at least one of said plates being suspended so that it is movable; and
  a mechanical coupler suspended above said substrate that slaves the motion of said slave capacitor's movable plate to the motion of said master capacitor's movable plate to trim the capacitance of said signal capacitor while electrically isolating the signal capacitor from the control capacitor.

20. The trimmable MEMS capacitor of claim 17, wherein said substrate is a Silicon-On-Insulator (SOI) substrate comprising a silicon substrate having a cavity etched there through, a patterned silicon dioxide layer, and a top silicon layer in which said signal capacitor, teeth and electrostatic actuator are defined so that they are anchored to said substrate and suspended over the cavity.

21. A noise compensated Micro Electro Mechanical System (MEMS) capacitor, comprising:
  a substrate;
  a flexure structure that is anchored to and suspended above said substrate so that it flexes along a direction of motion;
  a signal capacitor on said substrate that receives a signal voltage, said signal capacitor having a pair of opposing plates, at least one of said plates being connected to said flexure structure so that it can move in response to a control voltage to set the capacitance of said signal capacitor;
  a noise sensor for detecting extraneous mechanical motion that would deflect the signal capacitor's moveable plate thereby distorting its capacitance; and
  a signal conditioner that feeds back the detected motion to the signal capacitor to compensate for the extraneous mechanic motion.

22. The noise compensated MEMS capacitor of claim 21, wherein said signal conditioner adjusts the control voltage to directly null the effect of said extraneous motion on the signal capacitor's moveable plate.

23. The noise compensated MEMS capacitor of claim 21, wherein said signal conditioner computes the capacitance induced in said signal capacitor by said extraneous motion and subtracts it from the capacitance of the signal capacitor.

24. The nosie compensated MEMS capacitor of claim 21, wherein said noise sensor comprises a tunable MEMS capacitor whose capacitance is modulated by external vibrations.

* * * * *